United States Patent
Masubuchi (10) Patent No.: US 11,093,167 B2
(45) Date of Patent: Aug. 17, 2021

(54) STORAGE DEVICE AND CONTROL METHOD

(71) Applicant: TOSHIBA MEMORY CORPORATION, Minato-ku (JP)

(72) Inventor: Hayato Masubuchi, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 229 days.

(21) Appl. No.: 16/352,021

(22) Filed: Mar. 13, 2019

(65) Prior Publication Data

US 2020/0034068 A1 Jan. 30, 2020

(30) Foreign Application Priority Data

Jul. 26, 2018 (JP) .............................. JP2018-140502

(51) Int. Cl.
*G06F 3/06* (2006.01)
*G11C 16/30* (2006.01)
(Continued)

(52) U.S. Cl.
CPC ........... *G06F 3/0653* (2013.01); *G01K 1/022* (2013.01); *G01K 3/10* (2013.01); *G06F 3/0604* (2013.01);
(Continued)

(58) Field of Classification Search
CPC .............. G06F 1/00–3296; G06F 3/00; G06F 3/06–0689; G06F 5/00–16;
(Continued)

(56) References Cited

U.S. PATENT DOCUMENTS

| 4,738,903 A * | 4/1988 | Garow ................. H01M 8/0612 |
| | | 429/437 |
| 6,169,775 B1 * | 1/2001 | Takahashi ............... G01J 5/061 |
| | | 250/352 |

(Continued)

FOREIGN PATENT DOCUMENTS

| JP | 2017-130043 | 7/2017 |
| JP | 6185718 | 8/2017 |

OTHER PUBLICATIONS

Q. Zhang, P. Feng, S. Zhou, Z. Geng and N. Wu, "A novel RFID tag chip with temperature sensor in standard CMOS process," Proceedings of 2010 IEEE International Symposium on Circuits and Systems, Paris, France, 2010, pp. 1109-1112, doi: 10.1109/ISCAS.2010.5537333. (Year: 2010).*

(Continued)

*Primary Examiner* — Daniel C. Chappell
(74) *Attorney, Agent, or Firm* — Oblon, McClelland, Maier & Neustadt, L.L.P.

(57) ABSTRACT

According to one embodiment, a controller acquires temperature data periodically while receiving a first mode designating signal, writes the temperature data into a nonvolatile storage while or after the first mode designating signal, acquires temperature data after a lapse of a predetermined time from designation of the second mode, writes the temperature data into the nonvolatile storage while or after a lapse of a predetermined time since the designation of the second mode, acquires temperature data at a timing of changing from the second mode to the first mode, and write the acquired temperature data into the nonvolatile storage at or after the timing of changing from the second mode to the first mode.

12 Claims, 9 Drawing Sheets

(51) Int. Cl.
*G01K 3/10* (2006.01)
*G01K 1/022* (2021.01)
*G11C 16/04* (2006.01)

(52) U.S. Cl.
CPC .......... *G06F 3/0634* (2013.01); *G06F 3/0679* (2013.01); *G11C 16/30* (2013.01); *G11C 16/0483* (2013.01)

(58) Field of Classification Search
CPC .......... G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2003/0691–0698; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G11C 5/14–147; G11C 7/22; G11C 11/4076; Y02B 70/00–34; Y02D 10/00
See application file for complete search history.

(56) References Cited

U.S. PATENT DOCUMENTS

| | | | |
|---|---|---|---|
| 8,659,966 B2 * | 2/2014 | Choi | G11C 7/04 365/211 |
| 9,052,240 B2 * | 6/2015 | Elke | G01K 1/022 |
| 9,323,304 B2 * | 4/2016 | Salessi | G11C 5/14 |
| 9,405,337 B2 | 8/2016 | Kim et al. | |
| 9,658,791 B2 * | 5/2017 | Jayaraman | G06F 3/0625 |
| 9,658,800 B2 * | 5/2017 | Darragh | G11C 16/3422 |
| 9,760,311 B1 * | 9/2017 | Amir | G06F 3/0616 |
| 9,811,288 B1 * | 11/2017 | Chen | G06F 3/0685 |
| 2006/0053316 A1 * | 3/2006 | Yamazaki | G06F 1/3203 713/300 |
| 2010/0058080 A1 * | 3/2010 | Hirezaki | G06F 1/3221 713/310 |
| 2010/0301669 A1 * | 12/2010 | Lawrence | H02J 1/14 307/19 |
| 2012/0054518 A1 * | 3/2012 | Sadowski | G06F 1/3203 713/322 |
| 2012/0096294 A1 * | 4/2012 | Senba | G06F 1/3206 713/323 |
| 2012/0235141 A1 * | 9/2012 | Masubuchi | H05K 1/0298 257/48 |
| 2013/0024599 A1 * | 1/2013 | Huang | G06F 3/0611 711/102 |
| 2013/0054071 A1 * | 2/2013 | Yamane | H02J 7/0013 701/22 |
| 2013/0169347 A1 * | 7/2013 | Kim | G06F 1/206 327/513 |
| 2015/0092488 A1 * | 4/2015 | Wakchaure | G11C 16/26 365/185.03 |
| 2015/0220278 A1 * | 8/2015 | Sarcone | G06F 3/0688 711/103 |
| 2016/0062326 A1 * | 3/2016 | Bang | G06F 1/206 700/299 |
| 2016/0320995 A1 * | 11/2016 | Warriner | G06F 3/0679 |
| 2016/0363972 A1 * | 12/2016 | McNally | G06F 1/206 |
| 2017/0030777 A1 * | 2/2017 | Kimura | G11C 7/04 |

OTHER PUBLICATIONS

S. Wang, H. Lee, C. Grezes, P. Khalili, K. L. Wang and P. Gupta, "MTJ variation monitor-assisted adaptive MRAM write," 2016 53nd ACM/EDAC/IEEE Design Automation Conference (DAC), Austin, TX, USA, 2016, pp. 1-6, doi: 10.1145/2897937.2897979. (Year: 2016).*

* cited by examiner

| Power supply voltage \ Mode | Active | Idle | Shallow Device Sleep | Deep Device Sleep |
|---|---|---|---|---|
| DRAM(1.35V) | ON | ON | ON | OFF |
| Flash memory (1.8V) | ON | ON | ON | OFF |
| PD0 | ON | ON | ON | ON |
| PD1 | ON | ON | OFF | OFF |
| PD2 | ON | OFF | OFF | OFF |

STORAGE DEVICE AND CONTROL METHOD

CROSS-REFERENCE TO RELATED APPLICATIONS

This application is based upon and claims the benefit of priority from Japanese Patent Application No. 2018-140502, filed Jul. 26, 2018, the entire contents of which are incorporated herein by reference.

FIELD

Embodiments described herein relate generally to a storage device operable in a power-saving mode and a method of controlling the same.

BACKGROUND

Hard disk drives (hereinafter referred to as HDDs), solid-state drives (hereinafter referred to as SSDs) and the like are used as storage devices. The storage device is connected to a host. In a write operation, a write command and write data are transmitted from the host to the storage device, and the storage device writes the write data to a magnetic disk or nonvolatile semiconductor memory. In a read operation, a read command is transmitted from the host to the storage device, and the storage device reads data from the magnetic disk or nonvolatile semiconductor memory and transmits the read data to the host.

Some storage devices are equipped with a self-diagnosis function called Self-monitoring Analysis and Reporting Technology (SMART) for early detection of troubles and prediction of failures. In this function, there is an item for notifying the temperature of the storage device to the host.

It has been difficult to detect the temperature of the storage device itself and the temperature around the storage device separately.

DETAILED DESCRIPTION

Embodiments will be described hereinafter with reference to the accompanying drawings. The disclosure is merely an example and in no way restricts the invention to the following embodiment. Modifications which are easily conceivable by a person of ordinary skill in the art come within the scope of the invention as a matter of course. In some cases, to make the description clearer, the sizes, shapes and the like of the respective parts are illustrated schematically in the drawings, rather than as an accurate representation of what is implemented. In some cases, corresponding elements in the drawings are denoted by the same reference numbers and detailed description thereof is omitted unless necessary.

In general, according to one embodiment, a storage device includes a nonvolatile storage; a temperature sensor that detects a temperature of the nonvolatile storage and outputs it as temperature data; a controller that controls an operation of the nonvolatile storage and the temperature sensor. The controller is configured to receive a signal designating the first mode or the second mode from outside, acquire the temperature data from the temperature sensor periodically while receiving a signal designating the first mode, write the acquired temperature data into the nonvolatile storage while or after receiving a signal designating the first mode, acquire the temperature data from the temperature sensor after a lapse of a predetermined time from designation of the second mode, write the acquired temperature data into the nonvolatile storage while or after a lapse of a predetermined time since the designation of the second mode, acquire the temperature data from the temperature sensor at a timing of changing from the second mode to the first mode, and write the acquired temperature data into the nonvolatile storage at or after the timing of changing from the second mode to the first mode.

[General Configuration of System]

Figure 1:
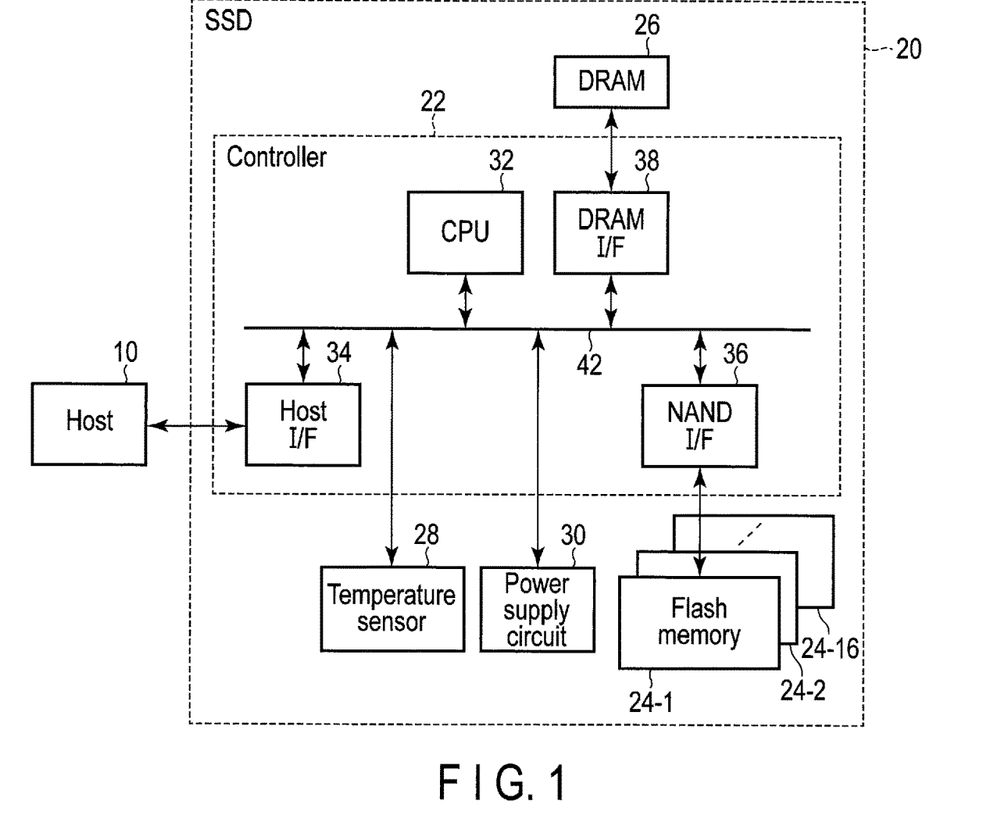
FIG. 1 is a block diagram showing a configuration example of an information processing system including an SSD according to an embodiment.

FIG. 1 is a block diagram showing a configuration of an example of an information processing system including an SSD. The system includes a host device (hereinafter referred to as a host) 10 and an SSD 20. The SSD 20 is a semiconductor storage device configured to write data into the nonvolatile semiconductor memory and to read data from the nonvolatile semiconductor memory.

The host 10 is a data processing device (also called computing device) that accesses the SSD 20, writes data into the SSD 20, or reads data from the SSD 20. The host 10 may be a server (also referred to as a storage server) that stores a large amount of various data in the SSD 20, or may be a personal computer. The SSD 20 can be used as a main storage of the host 10. The SSD 20 may be built in a housing of the host 10 or may be connected to the host 10 via a cable or a network. The host 10 can reduce the power consumption of the SSD 20 by reducing the number of running functions of the SSD 20 and can select either a normal mode or a power-saving mode as the power mode. The host 10 transmits a power mode designating command to the SSD 20.

The SSD 20 includes a controller 22, a flash memory 24 as a nonvolatile semiconductor memory, a DRAM 26, a temperature sensor 28, a power supply circuit 30. The controller 22 includes a CPU 32, a host I/F 34 for electrically interconnecting the host 10 and the SSD 20, a NAND I/F 36, a DRAM I/F 38, and the like. The CPU 32, the host I/F 34, the NAND I/F 36, and the DRAM I/F 38 can be connected to a bus line 42. The controller 22 may be realized by a circuit such as System-on-chip (SoC), ASIC, FPGA, and the like.

Various standards can be used as the host I/F 34 that electrically interconnects the host 10 and the SSD 20. For example, standards such as, Small Computer System Interface (SCSI) (registered trademark), PCI Express (registered trademark) (also referred to as PCIe (registered trademark)), Serial Attached SCSI (SAS) (registered trademark), Serial Advanced Technology Attachment (SATA) (registered trademark), Non Volatile Memory Express (NVMe (registered trademark)), Universal Serial Bus (USB) (registered trademark), Universal Asynchronous Receiver/Transmitter (UART) (registered trademark) can be used, but it is not limited thereto. In the following, SATA is adopted as the host I/F 34 for example.

The flash memory 24 is, for example, formed of a NAND type flash memory, but it is not limited to a NAND type flash memory, but another nonvolatile semiconductor memory may be used. The flash memory 24 may include a plurality of flash memory chips (or a plurality of flash memory dies). Here, sixteen flash memory chips 24-1, 24-2, . . . 24-16 are provided as an example. An arbitrary number of memories among the flash memories 24-1, 24-2, . . . 24-16 can simultaneously operate in parallel. As the number of memories which operate in parallel increases, the processing speed increases. Each chip 24-1, 24-2, . . . 24-16 is realized as a flash memory configured to be capable of storing one bit or a plurality of bits per memory cell. The reading data from or writing data to the flash memory 24 is controlled by the controller 22. The flash memory 24 is connected to the NAND I/F 36.

The DRAM 26 as a random access memory (RAM) which is one of a volatile memory is, for example, a DRAM (Dynamic Random Access Memory) of DDR3L (Double Data Rate 3 Low voltage) standard. The DRAM 26 may be provided with a write buffer, a read buffer, a cache area of a look-up table (LUT), and a storage area for system management information. The write buffer is a buffer area for temporarily storing data to be written into the flash memory 24. The read buffer is a buffer area for temporarily storing data read from the flash memory 24. The cache area of the look-up table (LUT) is an address translation table (also referred to as a logical address/physical address conversion table). The storage area of the system management information is various values and various tables used during the processing of the SSD 20. The LUT manages mapping between each logical address and each physical address of the flash memory 24. The DRAM 26 is connected to the DRAM I/F 38. The DRAM 26 may be provided outside the controller 22 but also may be provided inside the controller 22. In that case, an SRAM may be used instead of the DRAM 26. The SRAM is a volatile memory built in the controller 22 and capable of higher speed access.

The temperature sensor 28 detects the temperature of the SSD 20. The output of the temperature sensor 28 is transmitted to the controller 22 according to a serial communication standard such as I2C (Inter-Integrated Circuit) standard. The controller 22 controls the power supply circuit 30 based on the temperature of the SSD 20 and adjusts power supply which is output from the power supply circuit 30. In addition, if the temperature of the SSD 20 is high, the controller 22 controls the SSD 20 such that the amount of heat generated will be reduced. The amount of heat generated will be reduced by reducing the operation speed. The operation speed is reduced by reducing the internal clock frequency or reducing the number of flash memories 24 which operate in parallel.

The power supply circuit 30 generates internal power supplies necessary for the respective devices of the SSD 20 from one or more external power supplies. Power supply lines are not shown in FIG. 1. The power supply circuit 30 may be composed of one or more ICs. A control signal which controls the power supply circuit 30 is submitted from the controller 22 according to the serial communication standard such as I2C standard. Based on the command from the host 10, the controller 22 turns on or off the power supply to the respective devices of the SSD 20 from the power supply circuit 30. Thereby the controller 22 operates the SSD 20 on low power.

[External Appearance of SSD]

Figure 2:
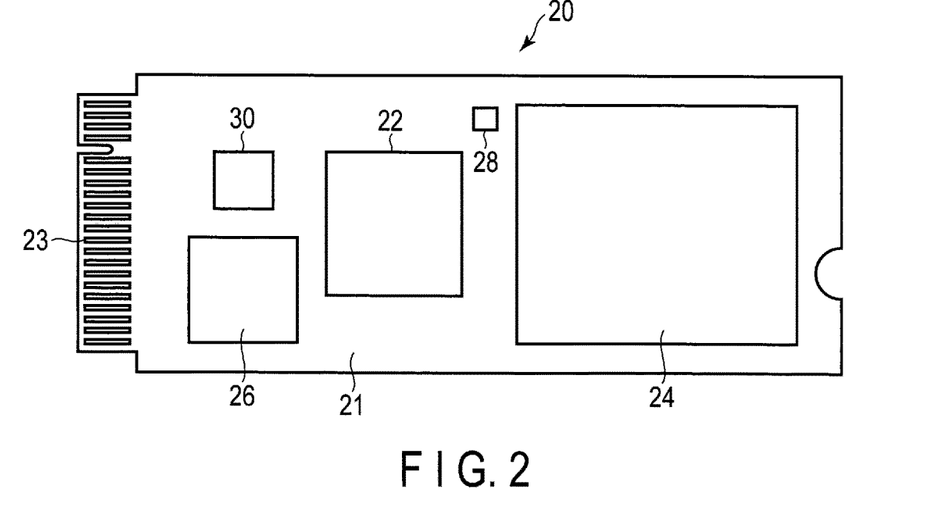
FIG. 2 is a plan view showing an example of a mechanical configuration of the SSD.

FIG. 2 is a plan view showing an example of the appearance of the SSD 20. The SSD 20 is provided with a substrate 21 for mounting components. The substrate 21 has a substantially rectangular shape. On the substrate 21, the controller 22, the flash memory 24, the DRAM 26, the temperature sensor 28 and the power supply circuit 30, which are circuit components each formed into an IC, are mounted. In recent years, as a standard of the substrate, there is the M.2 standard defined for the form factor and connection terminal of the built-in expansion card of the computer. The M.2 standard proposes various sizes and includes very small types such as 22 mm×42 mm, 22 mm×60 mm, 22 mm×80 mm, for example. As the SSD is miniaturized, the flash memory is also downsized. The downsized flash memory sometimes becomes high temperature during operation.

The SSD 20 is inserted into the slot of an electronic device, for example, the host 10 in a state where the SSD 20 is not packaged. For this reason, the temperature sensor 28 detects the temperature of the flash memory 24 but also detects the ambient temperature of the SSD 20. Accordingly, the temperature of the SSD 20 is influenced by the ambient temperature of the SSD 20.

A connector 23 which is electrically connected to the host 10 is provided at the side end along one shorter-side of the substrate 21. A wiring pattern (not shown) formed on the substrate 21 is electrically connected to particular terminal pins of the connector 23.

[Electrical Configuration of SSD]

Figure 3:
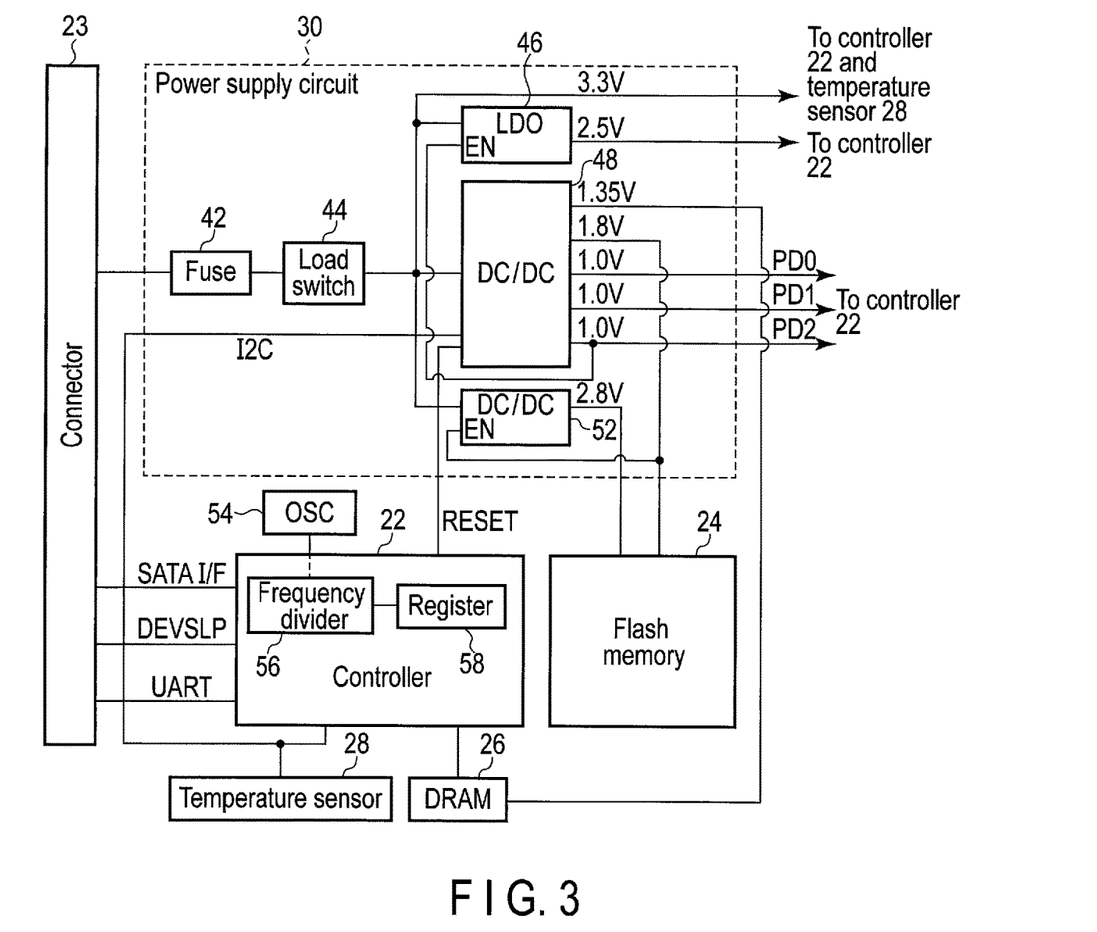
FIG. 3 is a block diagram showing an example of an electrical configuration of the SSD.

FIG. 3 is a block diagram showing the detailed electrical configuration of the SSD 20. The controller 22 and the power supply circuit 30 are connected to the connector 23. Data is transferred between the connector 23 and the controller 22 by SATA or DART. UART is used for writing a manufacturing firmware program into the flash memory 24 at a stage before shipment and is not used after shipment. After shipment, SATA is used. A device sleep (DEVSLP) signal is supplied from the host 10 to the SSD 20 to change the operation mode of the SSD 20. The device sleep (DEVSLP) signal is supplied to the controller 22 via the connector 23.

As shown in FIG. 1, the flash memory 24, the DRAM 26, the temperature sensor 28, and the power supply circuit 30 are connected to the controller 22. The temperature sensor 28 is connected to the controller 22 via I2C bus. The controller 22 transmits a read command regularly (for example, every several hundred milliseconds to several seconds) to the temperature sensor 28 and regularly acquires the output data of the temperature sensor 28 as a response. The controller 22 is connected to a DC/DC converter 48 of the power supply circuit 30 via the I2C bus. The controller 22 transmits a control signal to the DC/DC converter 48 via the I2C bus. The DC/DC converter 48 is configured to be capable of outputting power supplies of five systems. The power supply of the DC/DC converter 48 is controlled by the controller 22 using the control signal. The control of the power supply includes the control of the voltages of the respective power supplies output by the DC/DC converters 48. In addition, the number of systems of the power supplies output by the DC/DC converter 48 changes depending on the power state mode of the SSD 20. For example, the DC/DC converter 48 outputs the power supplies of five systems or fewer systems.

An oscillator 54 of a constant frequency (not shown in FIG. 1) is connected to the controller 22. A frequency divider 56 and a register 58 to which a frequency division ratio is set (not shown in FIG. 1) are incorporated in the controller 22. The output of the oscillator 54 is input to the frequency divider 56. The input is divided according to the frequency division ratio data set in the register 58, and output as the internal clock signal of the SSD 20. The frequency of the internal clock signal is changed by changing the frequency division ratio data set to the register 58. By setting the frequency of the internal clock signal low, the processing speed of the SSD 20 becomes slow. As a result, the amount of heat generated in the SSD 20 is small.

An external power supply is input to the power supply circuit 30 (for example, DC 3.3V). The external power supply is supplied as an input voltage to a low dropout (LDO) circuit 46 and the DC/DC converters 48 and 52 via a fuse 42 and a load switch 44 in series. When the voltage of the external power supply becomes equal to or higher than a threshold level, the fuse 42 is blown and the supply of the external power supply is stopped. The load switch 44 is an on/off switch. The load switch 44 is normally in an ON state. In the On state, the load switch 44 outputs the external power supply as the input voltage. When the external power supply becomes equal to or higher than a threshold level, the load switch 44 becomes an OFF state. In the OFF state, the load switch 44 outputs 0V. The threshold value of the voltage which blows the fuse 42 may be greater than or may be equal to the threshold value of the voltage at which the load switch 44 becomes the OFF state. Excessive current will be doubly prevented by the fuse 42 and the load switch 44.

The LDO 46 and the DC/DC converters 48 and 52 step down the input voltage and output the power supplies of the respective devices in the SSD 20. The DC/DC converters 48 and 52 output power supplies for devices which require a high current. The LDO 46 outputs a power supply for a device which requires a low current. For example, the LDO 46 steps down the input voltage and outputs a power supply of 2.5V for the controller 22. The DC/DC converter 48 steps down the input voltage and outputs a plurality of power supplies. That is, a power supply of 1.35V for the DRAM 26, a power supply of 1.8V for the flash memory 24, a first power supply PD0 of 1.0V for a first part of the controller 22, a second power supply PD1 of 1.0V for a second part of the controller 22, and a third power supply PD2 of 1.0V for a third part of the controller 22. The DC/DC converter 52 is supplied with a power supply of 1.8V for the flash memory 24 output from the DC/DC converter 48. Therefore, the DC/DC converter 52 does not operate while the power supply of 1.8V for the flash memory 24 is not output from the DC/DC converter 48. The LDO 46 is supplied with the second power supply PD2 output from the DC/DC converter 48. Therefore, the LDO 46 does not operate while the second power voltage PD2 is not output from the DC/DC converter 48. The DC/DC converter 48 is controlled by a power state mode signal supplied from the controller 22 via the I2C bus.

Figure 4:
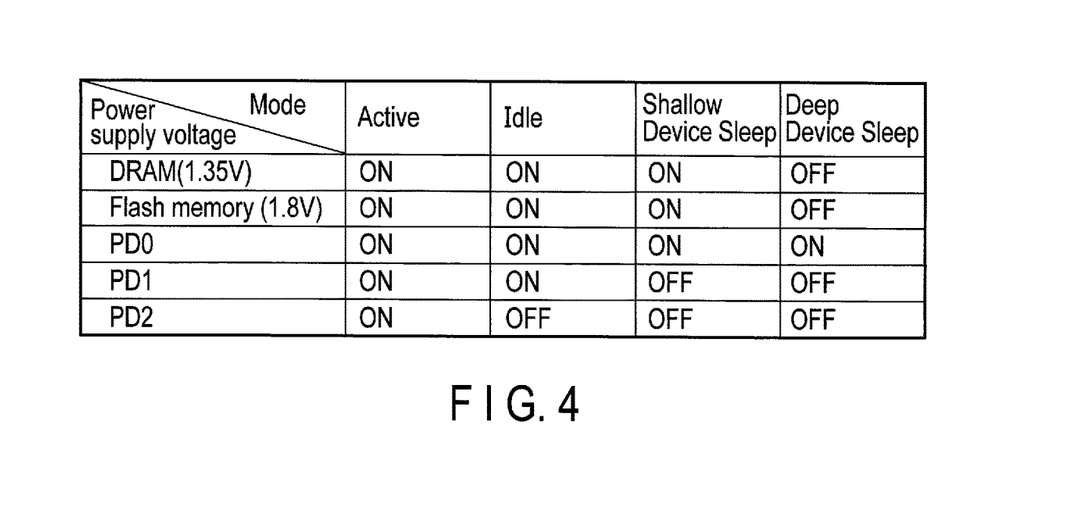
FIG. 4 is a diagram showing examples of power supplies which a DC/DC converter in a power supply circuit outputs in the respective power modes.

Examples of the output generated by the DC/DC converter 48 in each power states are shown in FIG. 4 (the power states will be described later). ON indicates output, and OFF indicates no output. In an active mode, the DC/DC converter 48 outputs the power supply of 1.35V for the DRAM 26, the power supply of 1.8V for the flash memory 24, the first power supply PD0, the second power supply PD1, and the third power supply PD2. In an idle mode, the DC/DC converter 48 outputs the power supply for the DRAM 26, the power supply for the flash memory 24, the first power supply PD0 and the second power supply PD1, but does not output the third power supply PD2. In a shallow device sleep mode, the DC/DC converter 48 outputs the power supply for the DRAM 26, the power supply for the flash memory 24, and the first power supply PD0, but does not output the second power supply PD1 and the third power supply PD2. In a deep device sleep mode, the DC/DC converter 48 outputs the first power supply PD0, but does not output the power supply for the DRAM 26, the power supply for the flash memory 24, the second power supply PD1, and the third power supply PD2.

As a result, the operation of the controller 22 is set to the power-saving operation according to the power state mode signal.

The DC/DC converter 52 steps down the input and outputs a power supply of 2.8V for the flash memory 24. The output signal of the load switch 44 is supplied to the controller 22 and the temperature sensor 28 as a power supply. After all the power supplies of five systems are output from the DC/DC converter 48, a reset signal is output from the DC/DC converter 48 to the controller 22, then the controller 22 starts operation.

The LDO 46 and the DC/DC converter 48 and 52 may be constituted as separate ICs or two or three of them may be constituted as one IC. The number of systems and values of the voltages which the LDO 46 and the DC/DC converters 48 and 52 output are not limited to the above-described number and values.

[Comparative Example]

The power-saving operation of the SSD 20 of the present embodiment will be described below. Firstly, to make a comparison with the embodiment, the first example of the operation of a comparative example will be described with reference to FIG. 5. In the comparative example, the host 10 negates the DEVSLP signal when the normal mode is set, and asserts the DEVSLP signal when a device sleep mode defined as the power-saving mode by SATA is set.

Figure 5:
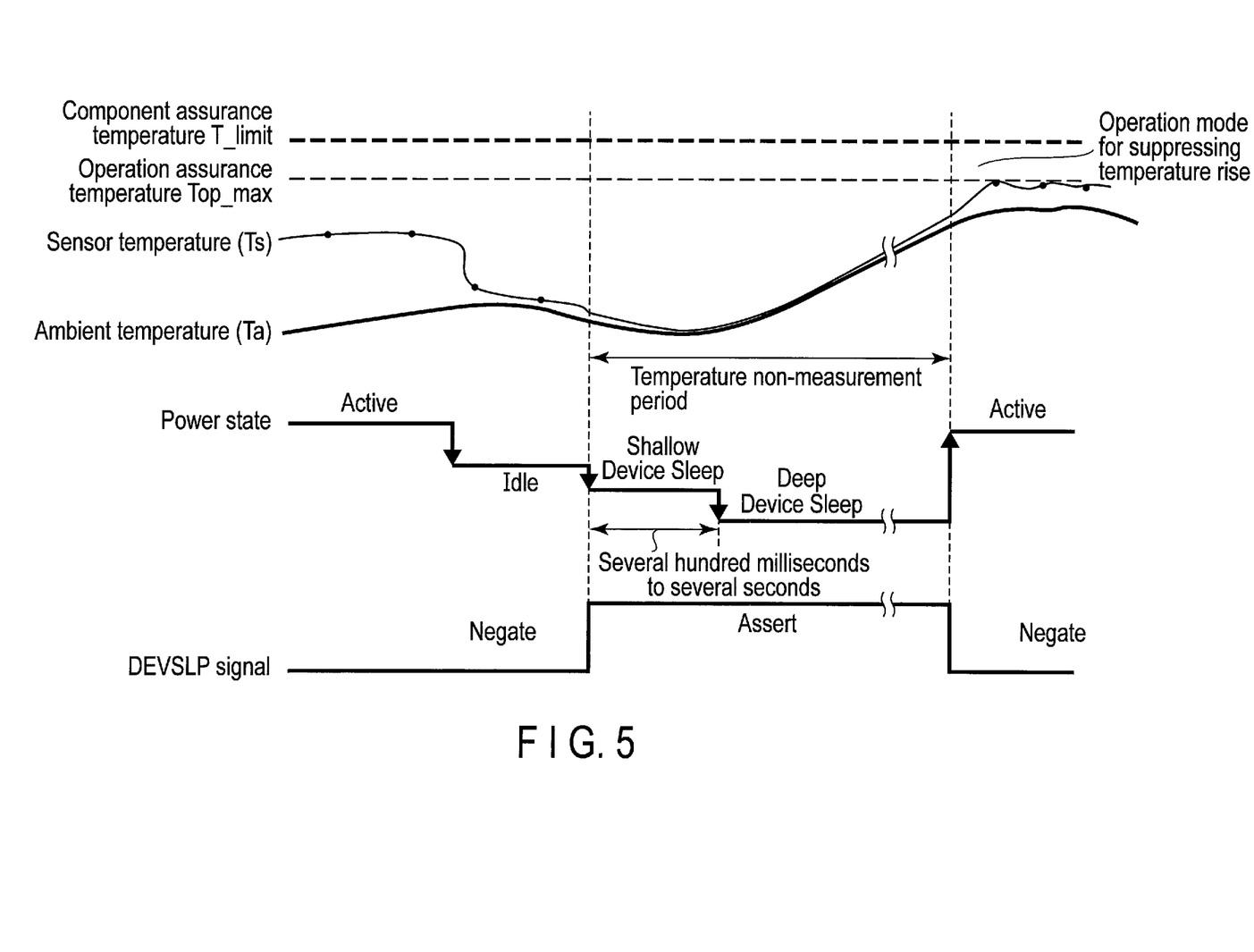
FIG. 5 is a diagram showing an operation example of the SSD when the temperature changes in a comparative example.

While the DEVSLP signal is negated, the controller 22 operates DC/DC converter 48 in the active mode. In the active mode, the DC/DC converter 48 outputs the power supplies of five systems. The power consumption at this time is several watts.

The processing of the controller 22 to take in the output of the temperature sensor 28 is executed by a firmware in the controller 22. To execute the firmware by the controller 22, the second power supply PD1 is required. While the DEVSLP signal is negated, the controller 22 acquires a sensor temperature Ts which the temperature sensor 28 detects via the I2C bus at regular time intervals and writes the acquired sensor temperature Ts into the flash memory 24.

When acquiring a notification request from the host 10, the controller 22 transmits the sensor temperature Ts to the host 10. The controller 22 controls the SSD 20 so as to suppress the heat generation. More specifically, heat generation of the SSD 20 is suppressed by reducing the clock frequency and the number of flash memories 24 operating in parallel. As a result, the sensor temperature Ts gradually decreases.

Upon receiving the idle request command from the host 10, the controller 22 causes the DC/DC converter 48 in the idle mode. Even when the command from the host 10 is not received for a certain period, the controller 22 causes the DC/DC converter 48 to operate in the idle mode. In the idle mode, the DC/DC converter 48 turns off the third power supply PD2 of the controller 22, thereby turning off the LDO 46. Therefore, some of the functions of the controller 22 are turned off, and the power consumption is reduced to 50 to 100 mill watts.

In SATA, the device sleep mode is divided into a shallow device sleep mode and a deep device sleep mode. When the device sleep mode is set, the shallow device sleep mode is executed first for a particular period, and the deep device sleep mode is executed afterward.

When the DEVSLP signal changes from a negated state to an asserted state, the controller 22 causes the DC/DC converter 48 in the shallow device sleep mode. In the shallow device sleep mode, the DC/DC converter 48 turns off the second power supply PD1 and the third power supply PD2. In the shallow device sleep mode, as compared with the idle mode, the number of functions which are turned off among the functions of the controller 22 is increased and the power consumption is further reduced. In the shallow device sleep mode, since the second power supply PD1 is turned off, the controller 22 cannot acquire the sensor temperature Ts.

When hundreds of milliseconds to seconds pass from the start of the shallow device sleep, the controller 22 causes the DC/DC converter 48 in the deep device sleep mode. In the deep device sleep mode, the DC/DC converter 48 outputs the first power supply PD0 but does not output the other power supplies. In the deep device sleep mode, as compared with the shallow device sleep mode, the number of functions which are turned off among the functions of the controller 22 is further increased and the power consumption is further reduced. The power consumption in the deep device sleep mode is 2 to 5 mill watts.

In the deep device sleep mode, the second power supply PD1 is not output, and the controller 22 does not acquire the sensor temperature Ts.

When the DEVSLP signal changes from the asserted state to the negated state, the controller 22 causes the DC/DC converter 48 in the active mode, and the controller 22 resumes acquiring the sensor temperature Ts at regular time intervals.

Figure 6:
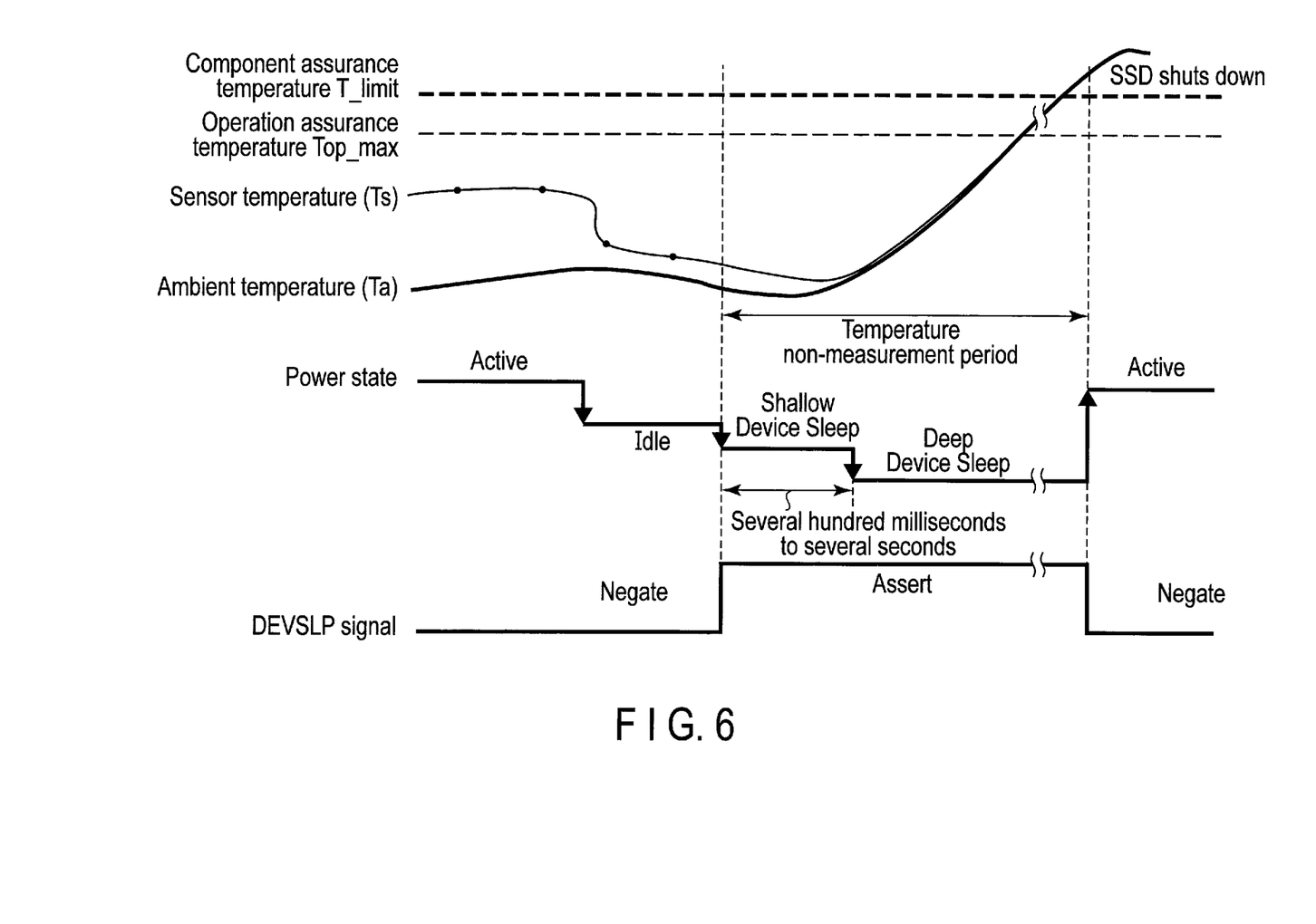
FIG. 6 is a diagram showing another operation example of the SSD when the temperature changes in the comparative example.

FIG. 6 shows the second example of the operation of a comparative example. In the second example, the case when the sensor temperature data Ts rises above the component assurance temperature T_limit will be described.

When the DEVSLP signal changes from the asserted state to the negated state, the controller 22 causes the DC/DC converter 48 in the normal mode. Then the controller 22 resumes acquiring the sensor temperature data Ts at regular time intervals. At this time, if the sensor temperature data Ts is higher than or equal to the component assurance temperature T_limit, the controller 22 shuts down the SSD 20. When the sensor temperature Ts rises due to an increase in the ambient temperature Ta, the SSD 20 itself does not generate heat. However, even if the SSD 20 itself is not generating heat, if the sensor temperature data Ts is higher than or equal to the component assurance temperature T_limit, the SSD 20 is determined to be broken and the controller 22 shuts down the SSD 20. In addition, the temperature data is not acquired during the device sleep mode, and the temperature data of this period is not stored in the flash memory 24. Therefore, even if the shutdown SSD 20 is analyzed, it is not possible to know, why the ambient temperature Ta has risen during the device sleep mode.

[Operation Example of Embodiment]

Figure 7:
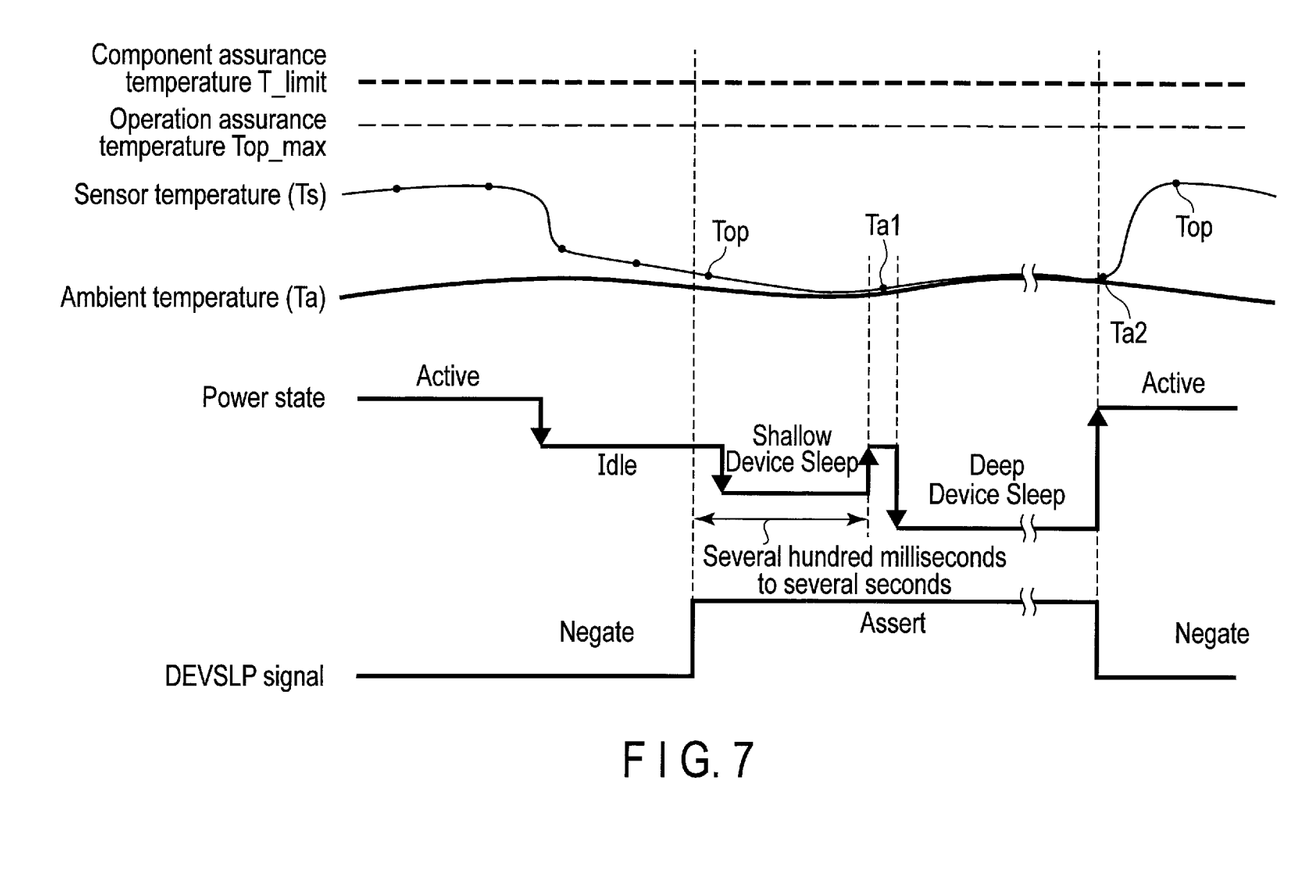
FIG. 7 is a diagram showing an operation example of the SSD when the temperature changes in the embodiment.
Figure 8:
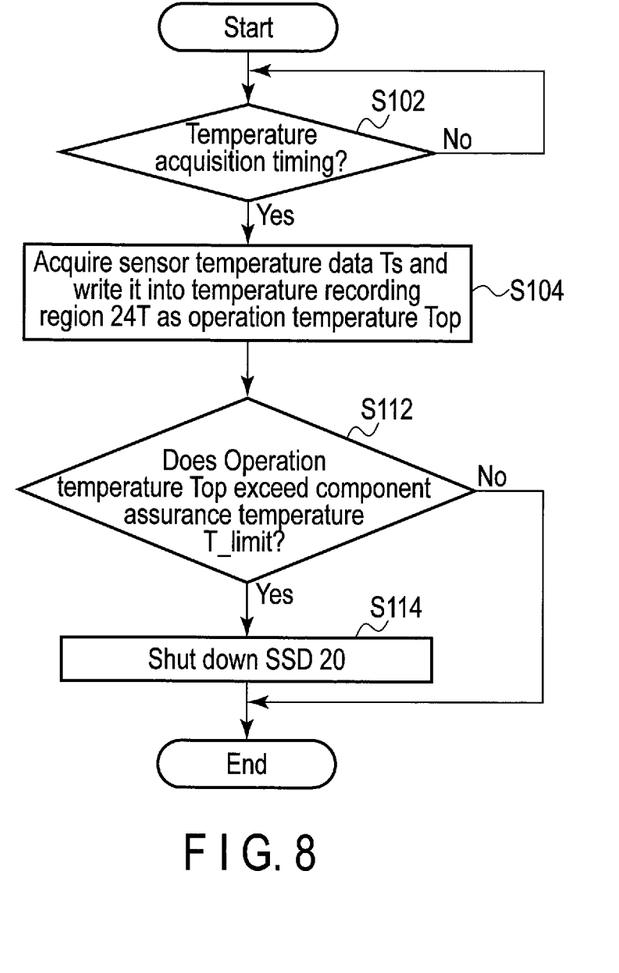
FIG. 8 is a flowchart showing an example of the operation of the SSD when the power state of the SSD is the active mode.

FIG. 7 shows an operation example of the SSD 20 according to an embodiment. The operation of the embodiment will be described with reference to the flowcharts of FIGS. 8, 9 and 10. FIG. 8 is a flowchart showing an example of the operation of the SSD 20 when the power state of the SSD 20 is the active mode. While the DEVSLP signal is negated, the controller 22 causes the DC/DC converter 48 in the active mode. In the active mode, the DC/DC converter 48 generates all the power supplies of five systems, and the LDO 46 and the DC/DC converter 52 are operable. In the active mode, the controller 22 acquires the sensor temperature data Ts at regular time intervals. In the active mode, the controller 22 determines whether it is temperature acquisition timing or not (S102). The determination of S102 is based on, for example, whether or not a particular period has passed. When it is the temperature acquisition timing (the determination result of S102 is Yes), the controller 22 acquires the sensor temperature Ts from the temperature sensor 28 and writes the acquired temperature Ts into a temperature recording table 24T in the flash memory 24 (S104). FIG. 11 shows an example of the temperature recording table 24T. In order to be differentiated from an ambient temperature Ta, the sensor temperature Ts acquired at this time is written into the temperature recording table 24T as the current value of the operation temperature Top. The temperature recording region 24T also stores the maximum value and the minimum value of the operation temperature Top in the past. The temperature recording table 24T may be prepared in the flash memory 24 or a nonvolatile memory which is different from the flash memory 24.

After writing the temperature Ts into the temperature recording table 24T (S104), the controller 22 determines whether the operation temperature Top exceeds the component assurance temperature T_limit or not (S112). If the operation temperature Top exceeds the component assurance temperature T_limit (the determination result of S112 is Yes), the controller 22 shuts down the SSD 20 (S114) and stops a series of operations of FIG. 8 (End). If the SSD 20 is shut down by the controller 22, the SSD 20 does not restart unless the SSD 20 receives a power supply restart command from the host 10. If the operation temperature Top does not exceed the component assurance temperature T_limit (the determination result of S112 is No), the controller 22 stops a series of operations of FIG. 8 (End).

In some cases, the power state of the SSD 20 may be changed from the active mode to the idle mode while the DEVSLP signal is negated. If the sensor temperature Ts is decreased to be lower than a threshold temperature, the power state of the SSD 20 becomes the idle mode.

Figure 9:
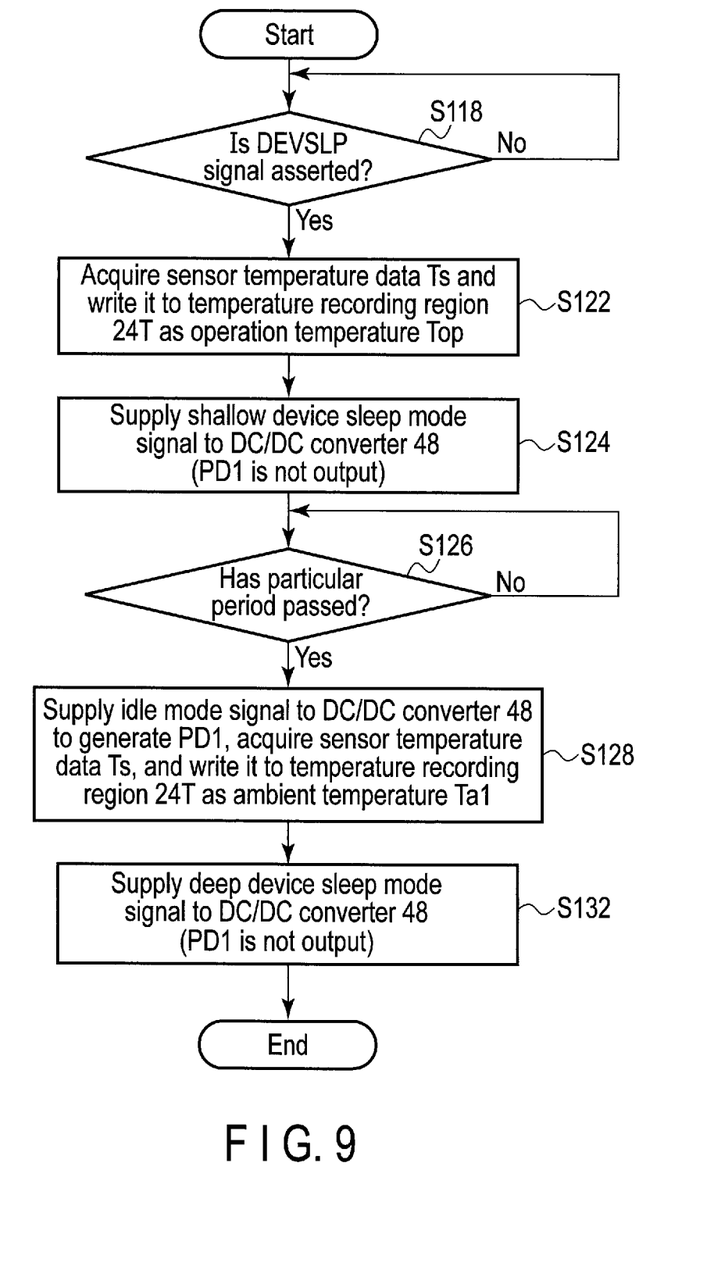
FIG. 9 is a flowchart showing an example of the operation of the SSD when the power state of the SSD is the active mode or the idle mode.

FIG. 9 is a flowchart showing an example of the operation of the SSD 20 when the power state of the SSD 20 is the active mode or the idle mode. In the active mode or the idle mode, the controller 22 determines whether the DEVSLP signal is asserted or not (S118). If the DEVSLP signal is negated (the determination result of S118 is No), the controller 22 performs the determination of S118 until the DEVSLP signal is asserted. If the DEVSLP signal is asserted (the determination result of S118 is Yes), the controller 22 acquires the sensor temperature Ts from the temperature sensor 28 and writes the acquired temperature Ts into the temperature recording table 24T (S122). The sensor temperature Ts acquired at this time is written into the temperature recording table 24T as the current value of the operation temperature Top. During the temperature writing processing of S122, the power state of the SSD 20 is maintained as either the idle mode or active mode and is not the shallow device sleep mode.

After writing the temperature Ts into the temperature recording table 24T (S122), the controller 22 supplies a shallow device sleep mode signal to the DC/DC converter 48 and causes the DC/DC converter 48 in the shallow device sleep mode (S124). In the shallow device sleep mode, the DC/DC converter 48 does not output the second power supply PD1 and the third power supply PD2, and the LDO 46 does not operate. The controller 22 does not acquire the sensor temperature Ts from the temperature sensor 28.

During the DC/DC converter 48 operates in the shallow device sleep mode, the controller 22 determines whether a particular period (for example, hundreds of milliseconds to seconds) has passed from the assertion of the DEVSLP signal or not (S126). The controller 22 repeats the determination of S126 until the particular period has passed. When the particular period has passed (the determination result of S126 is Yes), the controller 22 supplies the idle mode signal to the DC/DC converter 48 and causes DC/DC converter 48 in the idle mode. In the idle mode, the DC/DC converter 48 outputs the first power supply PD0 and the second power supply PD1. Therefore, the controller 22 acquires the sensor temperature Ts from the temperature sensor 28 and writes the acquired temperature Ts into the temperature recording table 24T (S128). The sensor temperature Ts acquired at this time is written into the temperature recording table 24T as an ambient temperature Ta1. Immediately before the temperature writing processing of S128, the power state of the SSD 20 is the shallow device sleep mode and the SSD 20 hardly generates heat.

After writing the temperature Ts into the temperature recording table 24T (S128), the controller 22 supplies the deep device sleep mode signal to the DC/DC converter 48 and causes the DC/DC converter 48 in the deep device sleep mode (S132). In the deep device sleep mode, the DC/DC converter 48 does not output the power supplies of four systems other than the first power supply PD0. In the deep device sleep mode, the controller 22 does not acquire the sensor temperature Ts from the temperature sensor 28. After the processing of S132, the controller 22 stops a series of operations of FIG. 9 (End).

Figure 10:
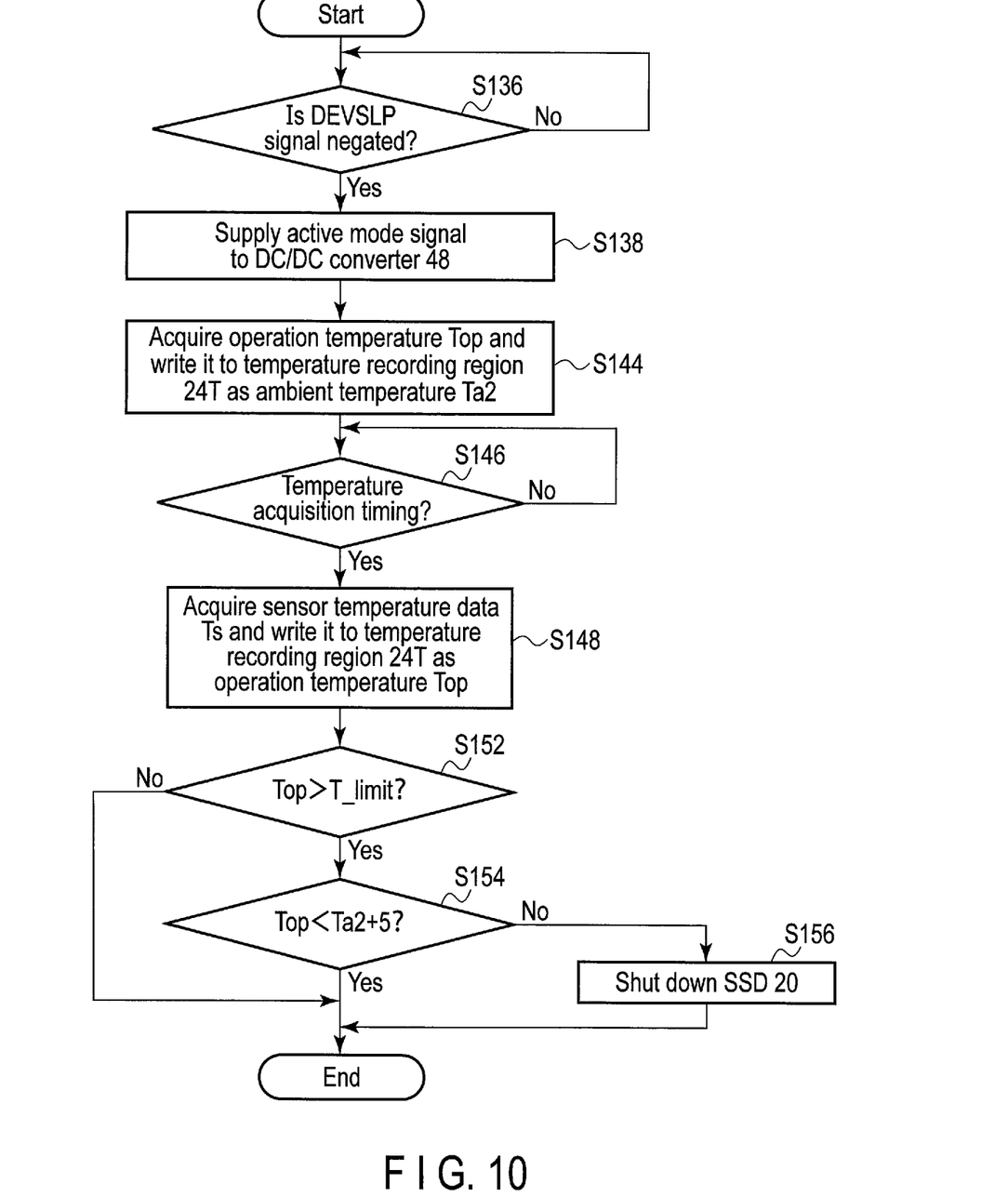
FIG. 10 is a flowchart showing an example of the operation of the SSD when the power state of the SSD is changed from the shallow device sleep mode or the deep device sleep mode to the active mode.
Figure 11:
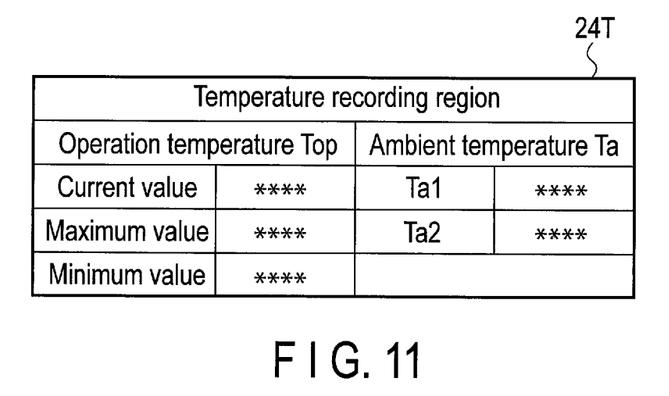
FIG. 11 is a diagram showing an example of the data structure of a temperature recording region of the embodiment.

FIG. 10 is a flowchart showing an example of the operation of the SSD 20 when the power state of the SSD 20 is changed from the shallow device sleep mode or the deep device sleep mode to the active mode. In the shallow sleep mode or the deep device sleep mode, the controller 22 determines whether the DEVSLP signal is negated or not (S136). If the DEVSLP signal is not negated (the determination result of S136 is No), the controller 22 repeatedly executes the determination of S136. If the DEVSLP signal is negated (the determination result of S136 is Yes), the controller 22 supplies the active mode signal to the DC/DC converter 48 and causes the DC/DC converter 48 in the active mode (S138). In the active mode, the DC/DC converter 48 generates all the power supplies of five systems.

During the DC/DC converter 48 operates in the active mode, the controller 22 acquires the sensor temperature Ts from the temperature sensor 28 and writes the acquired temperature Ts into the temperature recording table 24T (S144). The sensor temperature Ts acquired at this time is written into the temperature recording table 24T as an ambient temperature Ta2. The power state of the SSD 20 is the active mode in the processing of S144 but the power state of the SSD 20 is the shallow device sleep mode or the deep device sleep mode immediately before the processing of S138. Thus, the SSD 20 hardly generates heat.

After writing the temperature Ts into the temperature recording table 24T (S144), the controller 22 determines whether it is the temperature acquisition timing or not (S146). The determination of S146 is based on, for example, whether or not a particular period has passed after the DEVSLP signal is negated. When it is the temperature acquisition timing (the determination result of S146 is Yes), the controller 22 acquires the sensor temperature Ts from the temperature sensor 28 and writes the acquired temperature Ts into the temperature recording table 24T (S148). The sensor temperature Ts acquired at this time is written into the temperature recording table 24T as the current value of the operation temperature Top.

After writing the temperature Ts into the temperature recording table 24T (S148), the controller 22 determines whether the operation temperature Top is higher than or equal to the component assurance temperature T_limit or not (S152). If the operation temperature Top is not higher than or equal to the component assurance temperature T_limit (the determination result of S152 is No), the controller 22 stops a series of operations of FIG. 10 (End). If the operation temperature Top is higher than or equal to the component assurance temperature T_limit (the determination result of S152 is Yes), the controller 22 determines whether the operation temperature Top is lower than or equal to the sum of the ambient temperature Ta2 and a particular temperature (for example, 5 degrees) or not (S154).

The determinations of S152 and S154 will be described in details based on a specific example. It is assumed that the ambient temperature Ta2 at the time when the operation mode returns from the power-saving mode to the normal mode is 97 degrees (centigrade), the operation temperature Top acquired immediately after the operation mode returns to the normal mode is 101 degrees, and the component assurance temperature T_limit is 100 degrees. Although the operation temperature Top (=101 degrees) is higher than the component assurance temperature T_limit (=100 degrees), since the ambient temperature Ta2 is 97 degrees, that is, high, the operation temperature Top (=101 degrees) may be influenced by the ambient temperature Ta2 and the SSD 20 may be in a normal state where the SSD 20 does not generate heat. Therefore, even if the operation temperature Top is higher than or equal to the component assurance temperature T_limit in block 152, the controller 22 does not shut down the SSD 20 immediately. Instead, the controller 22 determines whether the operation temperature Top is lower than or equal to the sum of the ambient temperature Ta2 and the particular temperature (for example, 5 degrees) or not (S154).

If the operation temperature Top (=101 degrees) is lower than or equal to the sum of the ambient temperature Ta2 and the particular temperature (–102 degrees=97 degrees+5 degrees) (the determination result of S154 is Yes), the SSD 20 does not generate heat. On the other hand, if the operation temperature Top (=101 degrees) is not lower than or equal to the sum of the ambient temperature Ta2 and the particular temperature (=102 degrees) (the determination result of S154 is No), the SSD 20 generates heat.

If it is determined that the operation temperature Top is lower than or equal to the sum of the ambient temperature Ta2 and the particular temperature (the determination result of S154 is Yes), the controller 22 stops a series of operations of FIG. 10 (End).

If it is determined that the operation temperature Top is not lower than or equal to the sum of the ambient temperature Ta2 and the particular temperature (the determination result of S154 is No), the controller 22 shuts down the SSD 20 (S156) and stops a series of operations of FIG. 10 (End).

The particular temperature added to the ambient temperature Ta2 in the determination of S154 is not limited to 5 degrees. The criterion to determine the shutdown of the SSD 20 becomes more lenient as the particular temperature increases, while the criterion to determine the shutdown of the SSD 20 becomes stricter as the particular temperature decreases. A threshold temperature of the SSD 20 includes an operation assurance temperature Top_max in addition to the component assurance temperature T_limit. The operation assurance temperature Top_max is lower than the component assurance temperature T_limit. If the temperature is higher than a predetermined temperature, the controller 22 reduces an operating speed of the SSD 20 in order to suppress the temperature lower than the operation assurance temperature Top_max. The operating speed is lowered by lowering an internal clock frequency of the SSD 20 or reducing the number of flash memories 24 operating in parallel.

According to the embodiment, at least one particular timing during the power-saving mode in which the host 10 asserts the DEVSLP signal or immediately after the power-saving mode is changed to the normal mode, the DC/DC converter 48 outputs the power supply PD2. Therefore, the controller 22 acquires the sensor temperature from the temperature sensor 28 and writes the acquired temperature into the temperature recording table 24T. The temperature acquisition timing may be immediately after the DEVSLP signal is asserted, the time at which the shallow device sleep mode is changed to the deep device sleep, or immediately after the DEVSLP signal is negated. The sensor temperature acquired at the time when the shallow device sleep is changed to the deep device sleep and the sensor temperature acquired immediately after the DEVSLP signal is negated can be regarded as ambient temperatures since the SSD 20 hardly operates at these times.

The sensor temperature acquired immediately after the DEVSLP signal is asserted can be used as the ambient temperature Ta1 if the DEVSLP signal is negated immediately after being asserted (before the transition to the deep device sleep). When the SSD 20 is analyzed because of failure, etc., the ambient temperature Ta1 may also be used in some cases.

Since the controller 22 can recognize the ambient temperature, the controller 22 can determine whether the SSD 20 generated heat during the power-saving mode or not when the operation mode is changed from the power-saving mode to the normal mode. Therefore, the controller 22 can determine whether the sensor temperature is high because the ambient temperature has increased or the sensor temperature is high because the SSD 20 has generated heat. The controller 22 shuts down the SSD 20 if the sensor temperature has increased because the SSD 20 has generated heat, while the controller 22 does not shut down the SSD 20 and causes the SSD 20 to keep operating. If the sensor temperature is still high at the next temperature acquisition time, the controller 22 shuts down the SSD 20. For example, if the ambient temperature of the SSD 20 is 40 degrees, the sensor temperature output from the temperature sensor 28 is indicated as 40 degrees when the SSD 20 does not operate. The sensor temperature output from the temperature sensor 28 becomes higher than or equal to 40 degrees when the SSD 20 operates. In addition, if the ambient temperature is 0 degrees, the sensor temperature output from the temperature sensor 28 is indicated as 0 degrees when the SSD 20 does not operate. The sensor temperature output from the temperature sensor 28 may be increased to 40 degrees in some cases when the SSD 20 operates.

It is possible to check the status of use of the SSD 20 including the status of whether the SSD 20 is used at a temperature exceeding the operation assurance temperature Top_max or not by analyzing the temperature stored in the temperature recording table 24T.

The number of times the temperature is acquired while the DEVSLP signal is asserted may be more than two.

The storage device of the embodiment is also applicable to those other than SSDs, for example, HDDs. In addition, although the power-saving operation mode has been assumed the device sleep mode, the power-saving operation mode is not limited to this and may be another power-saving operation mode. The device sleep mode is assumed to include the shallow device sleep and the deep device sleep but may include one sleep state.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a nonvolatile storage;
   a temperature sensor that detects a temperature of the nonvolatile storage and outputs it as physical temperature data;
   a controller that controls an operation of the nonvolatile storage and the temperature sensor, wherein
   the controller is configured to
   receive a signal designating a first mode or a second mode from outside,
   acquire the physical temperature data from the temperature sensor periodically while the signal designates the first mode,
   write the acquired physical temperature data into the nonvolatile storage while the signal designates the first mode or after a lapse of a first time from a first timing when the signal designating the first mode is changed to designate the second mode,
   acquire the physical temperature data from the temperature sensor after a lapse of a second time from the first timing while the signal designates the second mode, the second time is longer than the first time,
   write the acquired physical temperature data into the nonvolatile storage while the signal designates the second mode or after a lapse of the second time from the first timing,
   acquire the physical temperature data from the temperature sensor at a second timing when the signal designating the second mode is changed to designate the first mode, and write the acquired temperature data into the nonvolatile storage at the second timing or after the second timing.

2. The storage device of claim 1, further comprising a power supply circuit, wherein the power supply circuit is configured to
supply a first power supply required for acquiring the physical temperature data to the controller while the signal designates the first mode;
supply a second power supply lower than the first power supply to the controller while the signal designates the second mode; and
supply the first power supply to the controller after a lapse of the second time from the first timing.

3. The storage device of claim 2, wherein
the second mode comprises:
a third mode in which the power supply circuit supplies a third power supply lower than the first power supply to the controller; and
a fourth mode in which the power supply circuit supplies a fourth power supply lower than the third power supply to the controller,
the storage device operates in the third mode during a first period and operates in the fourth mode after the first period, while the signal designates the second mode.

4. The storage device of claim 1, wherein the controller writes a current physical temperature data, a maximum physical temperature data in a past and a minimum physical temperature data in the past into the nonvolatile storage.

5. The storage device of claim 1, wherein the controller controls the operation of the nonvolatile storage based on first physical temperature data which is acquired at the second timing, and second physical temperature data which is first-acquired while the physical temperature data is acquired periodically while the signal designates the first mode.

6. The storage device of claim 5, wherein the controller shuts down the storage device when the second physical temperature data is higher than a component assurance physical temperature, and a sum of the first physical temperature data and a particular physical temperature data is not higher than the second physical temperature data.

7. A method of controlling a storage device comprising a nonvolatile storage, a temperature sensor that detects a physical temperature of the nonvolatile storage and outputs physical temperature data, a controller that controls an operation of the nonvolatile storage and the temperature sensor, the method comprising:
receiving a signal designating a first mode or a second mode from outside,
acquiring the physical temperature data from the temperature sensor periodically while the signal designates the first mode,
writing the acquired physical temperature data into the nonvolatile storage while the signal designates the first mode or after a lapse of a first time from a first timing when the signal designating the first mode is changed to designate the second mode,
acquiring the physical temperature data from the temperature sensor after a lapse of a second time from the first timing while the signal designates the second mode, the second time is longer than the first time,
writing the acquired physical temperature data into the nonvolatile storage while the second signal designates the second mode or after a lapse of the second time from the first timing,
acquiring the physical temperature data from the temperature sensor at a second timing when the signal designating the second mode is changed to designate the first mode, and
writing the acquired physical temperature data into the nonvolatile storage at the second timing or after the second timing.

8. The method of controlling the storage device of claim 7, further comprising:
supplying a first power supply required for acquiring the physical temperature data to the controller while the signal designates the first mode;
supplying a second power supply lower than the first power supply to the controller while the signal designates the second mode; and
supplying the first power supply to the controller after a lapse of the second time from the first timing.

9. The method of controlling the storage device of claim 8, wherein the second mode comprises a third mode in which the power supply circuit supplies a third power supply lower than the first power supply to the controller and a fourth mode in which the power supply circuit supplies a fourth power supply lower than the third power supply to the controller, the method further comprising:
operating the storage device in the third mode during a first period and operating the storage device in the fourth mode after the first period, while the signal designates the second mode.

10. The method of controlling the storage device of claim 7, further comprising:
writing a current physical temperature data, a maximum physical temperature data in a past and a minimum physical temperature data in the past into the nonvolatile storage by the controller.

11. The method of controlling the storage device of claim 7, further comprising:
controlling the operation of the nonvolatile storage by the controller based on first physical temperature data acquired at second timing and second physical temperature data which is first-acquired while the physical temperature data is acquired periodically while the signal designates the first mode.

12. The method of controlling the storage device of claim 11, further comprising:
shutting down the storage device by the controller when the second physical temperature data is higher than a component assurance physical temperature, and a sum of the first physical temperature data and a particular physical temperature data is not higher than the second physical temperature data.

* * * * *